United States Patent [19]

Tachimori et al.

[11] Patent Number: 4,725,742

[45] Date of Patent: Feb. 16, 1988

[54] SEMICONDUCTOR INTEGRATED CIRCUIT HAVING A TREE CIRCUIT

[75] Inventors: Hiroshi Tachimori, Fucyu; Hiroshi Fukuta, Kodaira; Takeshi Fukazawa, Higashimurayama; Takao Ohkubo, Fucyu; Osamu Takahashi, Kodaira, all of Japan

[73] Assignees: Hitachi, Ltd.; Hitachi VLSI Eng., both of Tokyo, Japan

[21] Appl. No.: 865,977

[22] Filed: May 22, 1986

[30] Foreign Application Priority Data

May 24, 1985 [JP] Japan .................... 60-110452

[51] Int. Cl.[4] .............. H03K 19/017; H03K 19/094
[52] U.S. Cl. .................. 307/449; 307/463; 307/443; 365/231
[58] Field of Search ........... 307/449, 463, 468, 469, 307/450, 270, 443, 451; 365/177, 230, 231

[56] References Cited

U.S. PATENT DOCUMENTS

| | | | |
|---|---|---|---|
| 3,355,598 | 11/1967 | Tuska | 307/463 |
| 3,551,900 | 10/1968 | Annis | 307/463 X |
| 4,140,924 | 2/1979 | Oguey et al. | 307/463 X |
| 4,176,287 | 11/1979 | Remedi | 307/463 |
| 4,354,175 | 10/1982 | Goldstein | 307/449 X |
| 4,684,829 | 8/1987 | Uratani | 307/449 |

FOREIGN PATENT DOCUMENTS 0041946 4/1978 Japan .................... 307/463

Primary Examiner—Stanley D. Miller
Assistant Examiner—David R. Bertelson
Attorney, Agent, or Firm—Antonelli, Terry & Wands

[57] ABSTRACT

A semiconductor integrated circuit device has an address decoder which is constructed of a plurality of MOSFETs implemented in a switch tree. The switch tree includes first and second switch tree portions which are controlled 'on' and 'off' by the same input signals. A first switch branch in the first switch tree portion, which is constructed of a comparatively small number of MOSFETs, and a second switch branch in the second switch tree portion, which is constructed of a comparatively large number of MOSFETs, are controlled 'one' and 'off' by the same input signal, while a second switch branch in the first switch tree portion, which is constructed of a comparatively large number of MOSFETs, and a first switch branch in the second switch tree portion, which is constructed of a comparatively small number of MOSFETs, are controlled 'on' and 'off' by the same input signal. This construction is effective to lessen an increase in the number of MOSFETs which are to be coupled to the input lines of the address decoder.

27 Claims, 6 Drawing Figures

SEMICONDUCTOR INTEGRATED CIRCUIT HAVING A TREE CIRCUIT

BACKGROUND OF THE INVENTION

This invention relates to a semiconductor integrated circuit, and concerns a technique which is effective for use in a semiconductor integrated circuit comprising a decoder circuit, for example, a semiconductor memory.

In a semiconductor memory such as RAM (random access memory) or ROM (read only memory), an address decoder which forms select signals for selecting memory cells is provided. The address decoder receives address signals of, e.g., n bits and forms one select signal in accordance with $2^n$ combinations of the address signals. By way of example, such an address decoder can be constructed of a plurality of unit decoders each of which comprises a NOR gate circuit and a NAND gate circuit. Here, in a case where such gate circuits are constructed of driving MOSFETs and load means or precharging MOSFETs, each gate circuit requires (n+1) MOSFETs. On the other hand, in a case where each gate circuit is constructed of a CMOS circuit composed of P-channel MOSFETs and N-channel MOSFETs, as many MOSFETs as 2n are required per gate circuit. In this manner, in the case of employing the logic gate circuit, the large number of elements are needed. This has now become a serious obstacle to attaining a higher integration density and a larger memory capacity of the semiconductor memory.

It is therefore considered that the number of elements is reduced by utilizing a switch tree decode construction. In the switch tree decode construction, however, the number of MOSFETs increases as the branch of a tree spreads, and whereas smaller numbers of MOSFETs are arranged near the base point of the tree, the number of MOSFETs to be disposed on the distal end side of the tree is enlarged in the extreme case. Accordingly, the gates of the large number of MOSFETs are connected in common to an input signal line for the MOSFETs on the distal end side. As a result, input gate capacitances and parasitic capacitances of large capacitance values are coupled to the input signal line. Such undesired capacitances retard the change of the input signal of the MOSFET on the distal end side, in other words, they retard the switching operation of the MOSFET, so that a higher speed operation cannot be achieved.

Regarding the address decoder of a dynamic RAM, refer to, for example, the official gazette of Japanese Patent Application Laid-open No. 53-41946.

SUMMARY OF THE INVENTION

An object of this invention is to provide a semiconductor integrated circuit which includes a decoder circuit having a simplified circuit arrangement and a raised operating speed.

The aforementioned and other objects and novel features of this invention will become apparent from the description of this specification and the accompanying drawings.

A typical aspect of performance of this invention will be briefly summarized below:

Each of a first switch tree portion and a second switch tree portion has a first branch part which is constructed of a comparatively small number of first switching elements, and a second branch part which is constructed of a comparatively large number of second switching elements, and both the first and second switch tree portions are controlled 'on' and 'off' by first and second signals. The first branch part of the first switch tree portion and the second branch part of the second switch tree portion are controlled 'on' and 'off' by the first signal, while the second branch part of the first switch tree portion and the first branch part of the second switch tree portion are controlled 'on' and 'off' by the second signal. According to this construction, the numbers of the switching elements to be coupled to signal lines which are supplied with the respective switch control signals are averaged.

DESCRIPTION OF THE PREFERRED EMBODIMENTS

Figure 1:
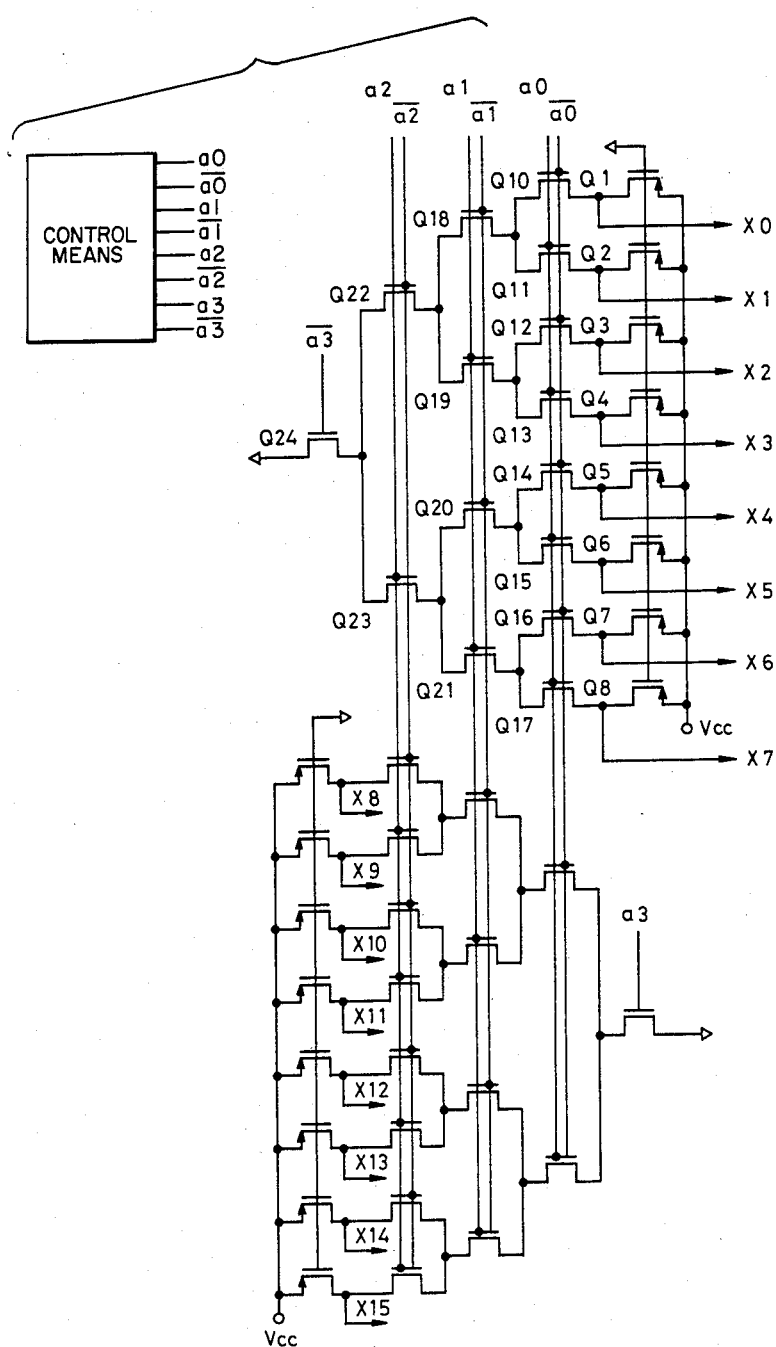
FIG. 1 is a circuit diagram showing an embodiment of an address decoder circuit according to this invention.

FIG. 1 shows a circuit diagram of an address decoder in the first embodiment of this invention. Various circuit elements in the figure are formed on a single semiconductor substrate such as single-crystal silicon by the known manufacturing techniques of CMOS (complememtary MOS) integrated circuits.

Though not especially restricted, an integrated circuit is formed on a semiconductor substrate which is made of single-crystal N-type silicon. A P-channel MOSFET is constructed of a P-type source region and a P-type drain region which are formed in the surface of such a semiconductor substrate, and a gate electrode made of, e.g., polycrystalline silicon which is formed on the part of the semiconductor substrate surface between such source and drain regions through a thin gate insulator film. An N-channel MOSFET is formed on a P-type well region which is formed in the semiconductor substrate surface. The respective MOSFETs are produced by the so-called self-alignment technique in which the gate electrodes made of polycrystalline silicon as stated above are employed as a kind of impurity introducing mask. In case of this structure, the semiconductor substrate forms the common substrate gate of a plurality of P-channel MOSFETs formed thereon. The P-type well region forms the substrate gate of the N-channel MOSFET formed thereon. The substrate gate of the P-channel MOSFETs, namely, the N-type substrate is maintained at the supply voltage level of the circuit, while the body gate of the N-channel MOSFET, namely, the P-type well region is maintained at the ground potential of the circuit.

The address decoder in the figure is formed on the semiconductor substrate along with an address buffer, not shown, which produces address signals $\overline{a0}$ through $\overline{a3}$ of true level and address signals a0 through a3 of low level in response to address signals A0 through A3 respectively. The address signals of the complementary levels such as the address signals a0 and $\overline{a0}$ shall be termed the complementary address signals.

The illustrated address decoder forms 16 decoded outputs X0–X15 on the basis of the complementary address signals a0, $\overline{a0}$–a3, $\overline{a3}$ of 4 bits. Though not especially restricted, the complementary address signals a3 and $\overline{a3}$ are regarded as the most significant bit-address signals, and those a0 and $\overline{a0}$ as the least significant bit-address signals.

The address signal $\overline{a3}$ of the inverted or low level at the most significant bit is supplied to the gate of a MOSFET Q24 whose source is coupled to the ground potential point of the circuit. With this MOSFET Q24 as a base point, the drain thereof is provided with two MOSFETs Q22 and Q23 which constitute a first branch. The gates of these two MOSFETs Q22 and Q23 are respectively supplied with the inverted address signal a2 and the address signal $\overline{a2}$ of the non-inverted or true level.

The drains of the two MOSFETs Q22 and Q23 are respectively provided with two MOSFETs Q18, Q19 and Q20, Q21 which constitute several branches. The gates of the two MOSFETs Q18, Q19 or Q20, Q21 are respectively supplied with the inverted address signal $\overline{a1}$ and the non-inverted address signal a1.

The drains of the two MOSFETs Q18, Q19 and Q20, Q21 are respectively provided with two MOSFETs Q10 and Q11, Q12 and Q13, Q14 and Q15, and Q16 and Q17 which constitute third branches. The gates of these two MOSFETs Q10 and Q11, Q12 and Q13, Q14 and Q15, and Q16 and Q17 are respectively supplied with the inverted address signal $\overline{a0}$ and the non-inverted address signal a0. All of the above MOSFETs Q10–Q24 are N-channel MOSFETs.

Load means, which is constructed of P-channel MOSFETs Q1–Q8 though not restricted thereof, is disposed between the drains of the MOSFETs Q10–Q17 of the final branches and the supply voltage $V_{cc}$. These MOSFETs Q1–Q8 operate as resistance elements in such a way that their gates are steadily supplied with the ground potential of the circuit. The MOSFETs Q1–Q24 mentioned above constitute a first group of MOSFETs. Eight of the decoded output signals, X0–X7 are delivered from the drains of the MOSFETs Q10–Q17 of the final branches. Among these decoded output signals X0–X7, ones selected according to the combination of the 4-bit address signals are made a low level such as the ground potential of the circuit, and non-selected output signals are made a high level such as the supply voltage $V_{cc}$. More specifically, if all the inverted address signals $\overline{a0}$–$\overline{a3}$ are at the high level, the MOSFETs Q10, Q18, Q22 and Q24 are responsively brought into 'on' states, and hence, only the decoded output signal X0 is made the selection level of the low level. The remaining decoded outputs X1–X7 (and X8–X15 to be described later) are all made the non-selection level of the high level ($V_{cc}$) because any MOSFETs in series therewith are brought into 'off' states by the low level of the non-inverted address signals a0–a3.

The decoded output signals X0–X7 are inverted by driver circuits not shown, constructed of CMOS inverter circuits or the like and are then transmitted to the word lines of a memory array or the gates of column switch MOSFETs not shown, arranged on the right of the illustrated decoder.

The remaining decoded output signals X8–X15 are formed by a second group of MOSFETs which take a switch tree configuration similar to the above. However, the MOSFET at a base point is supplied with the non-inverted address signal a3, and the MOSFETs at branch points to be supplied with the remaining complementary address signals a0, $\overline{a0}$–a2, $\overline{a2}$ are different. More specifically, the gates of the MOSFETs of the first branch in the switch tree of this second group are supplied with the complementary address signals a0, $\overline{a0}$ which are fed to the MOSFETs at the final branch points in the first group. The gates of the MOSFETs of the second branches in the switch tree of the second group are supplied with the complementary address signals a1, $\overline{a1}$ which are fed to the MOSFETs at the second branch points in the first group. Lastly, the gates of the MOSFETs of the final (third) branches in the switch tree of the second group are supplied with the complementary address signals a2, $\overline{a2}$ which are fed to the MOSFETs of the first branch points in the first group. In other words, at the branches except the base points in the switch trees of the first and second groups, the MOSFETs have the gates supplied with the corresponding complementary address signals symmetrically with respect to the intermediate second branches (the complementary address signals a1, $\overline{a1}$).

In the decoder of the above construction, the MOSFETs located near the root of the switch tree such as the MOSFETs Q24, Q22 and Q23 may be arranged within the pitch of the plurality of MOSFETs Q10 thru Q17 constituting the final switch branches, and hence, they may be respectively fabricated with comparatively large sizes. A MOSFET of large size, however, has a great gate capacitance or input capacitance. In the presence of such a great capacitance, the varying rate of an address signal applied to an address input line is drastically limited, and a transient current for charging or discharging such a capacitance is inevitably set at a comparatively high level. The transient current is caused to flow to the power source wiring or ground wiring of the circuit through the address buffer not shown. When the transient current is great, comparatively great noise appears in the power source wiring or the ground wiring.

In the address decoder of this embodiment, the MOSFETs such as those Q1 thru Q24 constituting the switch trees have sizes equal to one another. That is, notwithstanding that the MOSFETs Q18 thru Q24 can be made larger in size than those Q19 thru Q17, they are fabricated with comparatively small sizes. Accordingly, capacitances to be coupled to the respective address input lines become small, and the varying rates of the corresponding address signals become high.

Though not especially restricted, the address input lines are constructed of polycrystalline silicon layers which are integral with the gate electrodes of the MOSFETs constituting the switch tree. The wiring between the MOSFETs constituting the switch tree, for example, the wiring between the drain of the MOSFET Q24 and the sources of the MOSFETs Q22 and Q23 may be constructed of the so-called semiconductor interconnection region which is formed simultaneously with the drain and the sources. In this embodiment, however, such wiring is constructed of an aluminum layer as a first layer interconnection which is formed on the semiconductor substrate through a first interlayer insulator film. Thus, a capacitance and a wiring resistance in a wiring part for the mutual coupling of the MOSFETs are reduced. Output wiring lines X0 thru X15 can be constructed of the first layers of aluminum layers. Output wiring lines X8 thru X15 are extended toward the memory array across a MOSFET forming area for constructing the switch tree.

The address input lines made of the polycrystalline silicon layers have comparatively high resistance. In order to lower the resistances of the address input lines, a second interlayer insulator film and second aluminum interconnection layers may be formed. The second layers of aluminum interconnection layers are caused to intersect the first layers of aluminum interconnection layers through the second interlayer insulator film, and are held in contact with the polycrystalline silicon layers through proper contact holes.

In this embodiment, each of the address signals a0 and $\overline{a0}$ of the least significant bit is fed to the gates of the five MOSFETs, each of the address signals a1 and $\overline{a1}$ of the second bit is fed to the gates of the four MOSFETs, and each of the address signals a2 and $\overline{a2}$ of the third bit is fed to the gates of the five MOSFETs similarly to the least significant bit signals a0 and $\overline{a0}$. Thus, the numbers of MOSFETs to be coupled to the signal lines which are supplied with the corresponding address signals are averaged. As a result, the values of the input gate capacitances or parasitic capacitances to be coupled to the respective signal lines are averaged, and the maximum capacitance value to be set can be reduced. By the way, in a case where the address signals a0 and $\overline{a0}$ are fed to the MOSFETs of the final branches also in the switch tree of the second group, the number of these MOSFETs becomes as large as eight. The reduction number of such MOSFETs becomes very large with increase in the number of stages of the switch tree. For example, in case of forming the selection signals of as many select lines as 1024 by the use of address signals of 10 bits, the maximum number of MOSFETs can be reduced by as large as 384 by the application of this invention.

Figure 2:
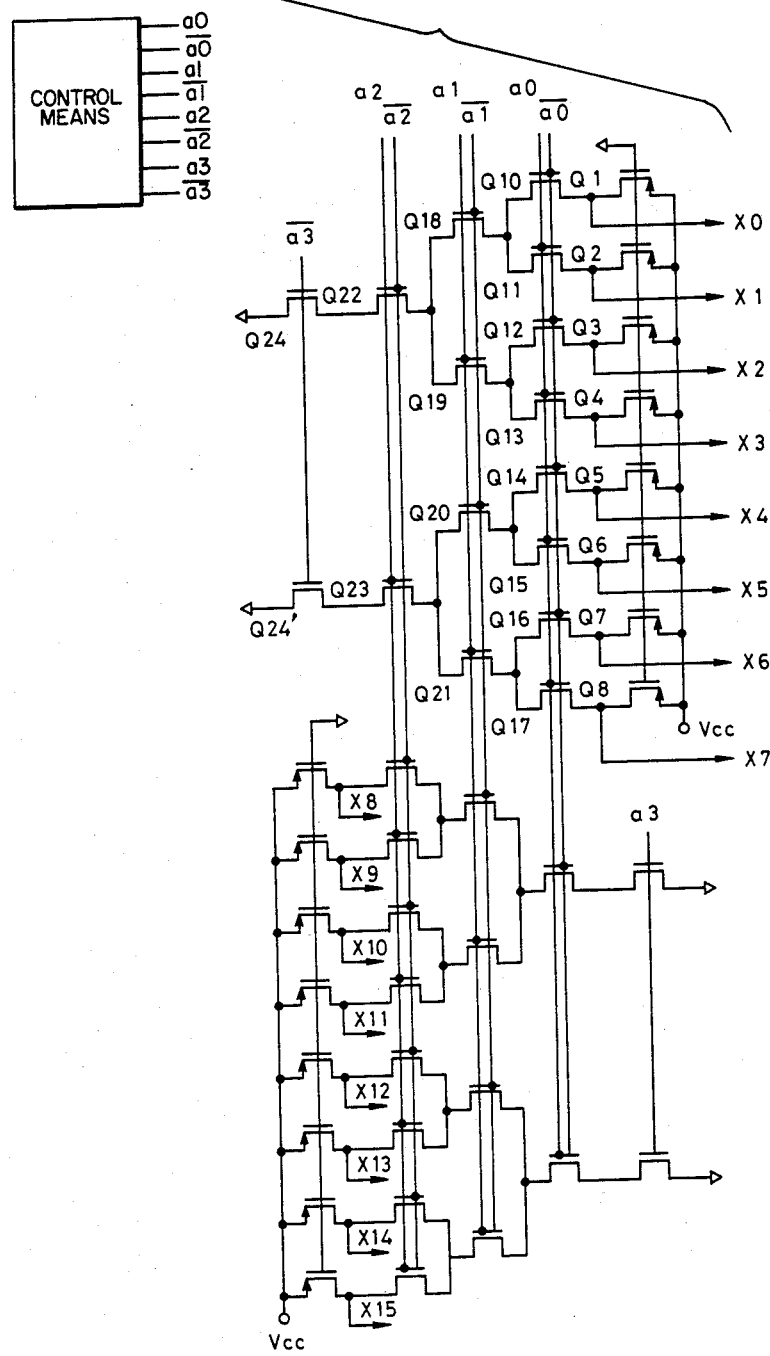
FIG. 2 is a circuit diagram showing another embodiment of the address decoder circuit according to this invention.

FIG. 2 shows a circuit diagram of an address decoder in the second embodiment of this invention.

In the case of the embodiment of FIG. 1, the wiring for the coupling between the MOSFET of the base point and the MOSFETs of the first branch has a great wiring length because the tree spreads successively. To the end of, for example, a higher integration density, the wiring is constructed of an aluminum interconnection or a semiconductor interconnection layer such as a diffused layer which is formed integrally with the source or drain of the MOSFET. The long wiring hampers enhancement of the operating speed of the decoder. In this embodiment, therefore, the wiring length is shortened in such a way that, for example, the MOSFET of the base point in the switch tree of the first group is divided in two, MOSFETs Q24 and Q24'. This measure applies also to the switch tree of the second group. Thus, the wiring length on the base point side can be shortened, so that a raised speed of the operation can be attained.

Figure 3:
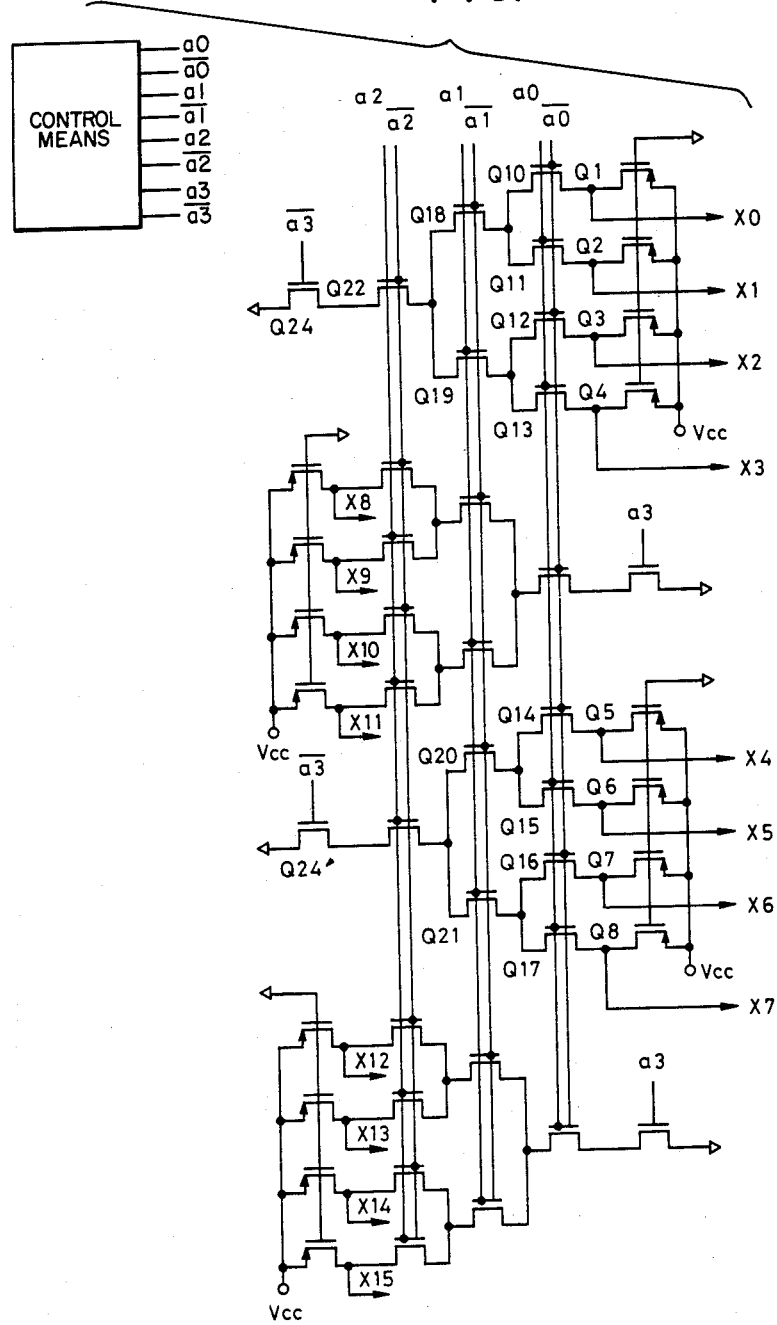
FIG. 3 is a circuit diagram showing another embodiment of the address decoder circuit according to this invention.

FIG. 3 shows a circuit diagram of an address decoder in the third embodiment of this invention.

In this embodiment, note is taken of the fact that by providing the two MOSFETs at the base point as in the embodiment of FIG. 2, each of the switch trees of the first and second groups can be divided in two and that the whole configuration forming the divided switch tree is triangular. The half switch tree in the switch tree of the second group is arranged adjacent to the half switch tree in the switch tree of the first group. Owing to such a construction, the triangles made smaller by the division can be arranged in axial symmetry, and hence, the MOSFETs constituting the address decoder can be laid out at a higher density.

Figure 4:
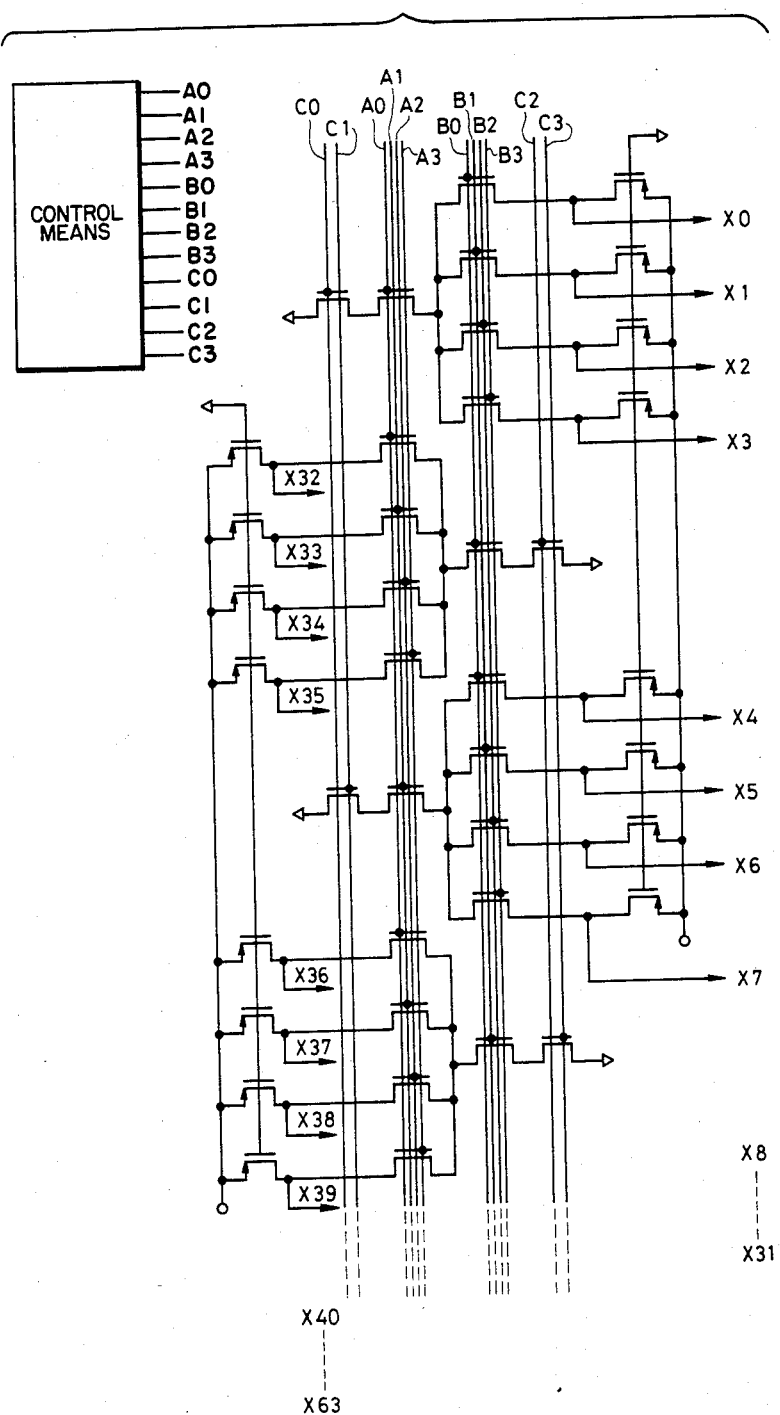
FIG. 4 is a circuit diagram showing still another embodiment of the address decoder circuit according to this invention.

FIG. 4 shows a circuit diagram of an address decoder in the fourth embodiment of this invention.

In this embodiment, the address decoder circuit is divided in two as a whole. Input signals to be supplied to the illustrated switch trees consist of four types of input signals A0-A3, B0-B3 and C0-C3 formed by a pre-decoder circuit (not shown) which decodes address signals each being composed of 2 bits. Each of the input signals A0 thru A3 is formed of address signals of 2 bits. By way of example, the input signal A0 is put to a level "1" when the 2-bit address signals are "00", and the input signal A3 is put to the level "1" when the 2-bit address signals are "11". The input signals A1 and A2 are put to the level "1" when the 2-bit address signals are "01" and "10", respectively. Likewise, each of the input signals B0 thru B3 and C0 thru C3 has its level determined by the 2-bit address signals.

The switch trees have the MOSFETs of the base points and the first branches divided by a construction similar to that of the embodiment in FIG. 3, and the divided switch trees of the first and second groups are alternately arranged. Since the four types of pre-decoded signals are supplied as the input signals as described above, four MOSFETs are disposed at the branch point.

Using the pre-decoded signals as stated above, the number of branch stages can be reduced. Thus, the number of driving MOSFETs to be connected in series with load MOSFETs can be lessened, so that a raised speed operation can be realized. Since the pre-decoder circuit has the small number of input bits, it may well be constructed of NOR or NAND gate circuits or the like.

Figure 5:
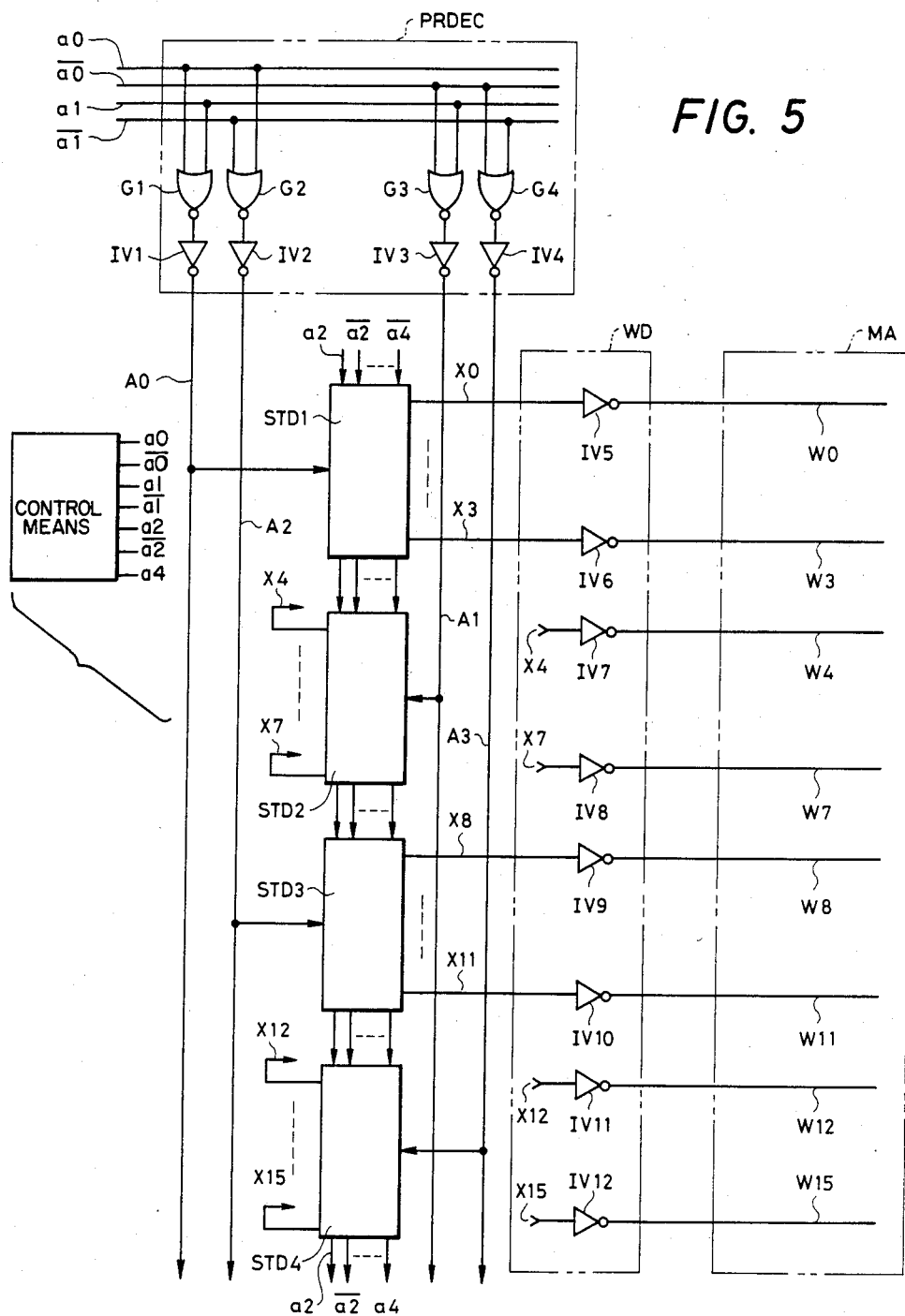
FIG. 5 is a circuit diagram of another embodiment.

FIG. 5 is a circuit diagram of a fifth embodiment.

As shown in the figure, a pre-decoder circuit PRDEC is constructed of NOR circuits G1 thru G4 and inverter circuits IV1 through IV4.

Decoder circuits of the switch tree construction, STD1 thru STD4 are constructed similarly to the decoder circuit in FIG. 1. In the decoder circuit STD1, however, a MOSFET corresponding to the MOSFET Q24 in FIG. 1 is not provided. The output wiring line A0 of the predecoder circuit PRDEC is coupled to sources like those of the MOSFETs Q22 and Q23 in FIG. 1. Therefore, the MOSFET corresponding to the MOSFET Q24 may be regarded as being replaced with a unit decoder circuit in the pre-decoder circuit PRDEC, in other words, the NOR circuit G1 and the inverter circuit IV1.

Likewise, a MOSFET corresponding to a base point in each of the decoder circuits STD2 thru STD4 is replaced with the pre-decoder circuit PRDEC.

The outputs X0 thru X15 of the decoder circuits STD1 thru STD4 are supplied to a word line driving circuit WD which is constructed of inverter circuits IV5 thru IV12. The outputs of the word line driving circuit WD are supplied to the word lines W0 thru W15 of a memory array MA which is constructed of static memory cells (not shown).

According to this embodiment, owing to the adoption of the pre-decoder circuit PRDEC, the number of MOSFETs to be connected in series within the decoder circuits STD1 thru STD4 can be lessened. The ground wiring line to be coupled to the source of the MOSFET Q24 in FIG. 1 is replaced with the output wiring lines A0 thru A3 of the pre-decoder PRDEC. It is therefore possible to lessen the number of total wiring lines for the decoder circuit.

Figure 6:
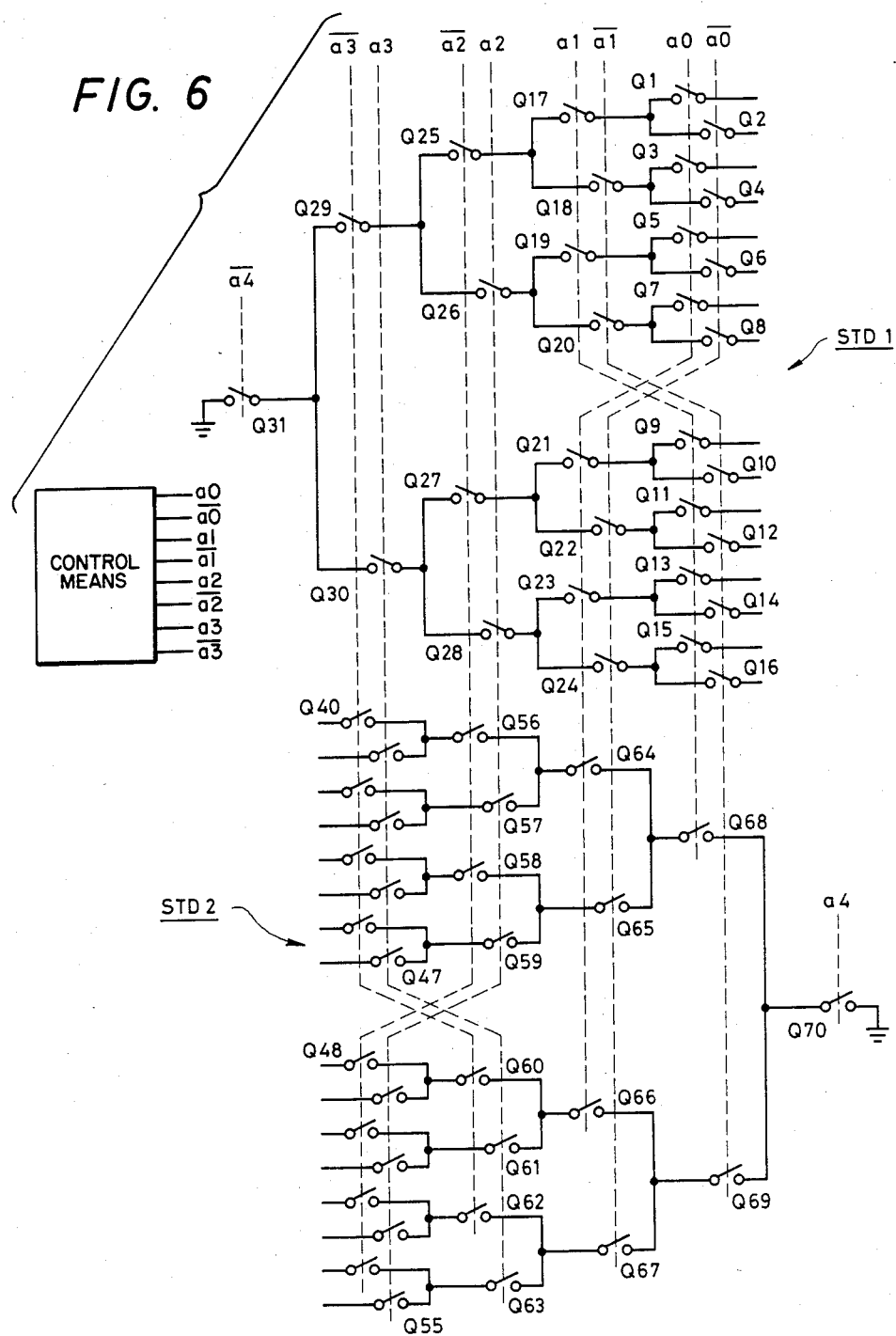
FIG. 6 is a circuit diagram of an address decoder in another embodiment.

FIG. 6 is a circuit diagram of a decoder circuit in a sixth embodiment.

In this embodiment, in a switch tree portion STD1 which is constructed of switching elements Q1 thru Q31, address input lines a0, $\overline{a0}$ and a1, $\overline{a1}$ are exchanged as shown in the figure. Likewise, in a switch tree portion STD2 which is constructed of switching elements Q40 thru Q70, address input lines a2, $\overline{a2}$ and a3, $\overline{a3}$ are exchanged. The switching elements Q1 thru Q3 and Q40 thru Q70 are made up of MOSFETs as in the preceding embodiments.

According to this embodiment, the address input lines are exchanged within each switch tree portion, with the result that the numbers of the switching elements to be coupled to the respective address input lines can be favorably averaged.

In accordance with this invention, the following effects can be achieved:

(1) A switch tree decode construction is employed, and the MOSFETs of branches constituting two switch trees, except the MOSFETs of base points to be fed with specified complementary input signals, are symmetrically supplied with the remaining complementary address signals, to average the numbers of the MOSFETs which are supplied with the input signals. These bring forth the effects that the number of elements as a whole can be reduced and that a higher operating speed based on decreases in the values of input gate capacitances and the values of parasitic capacitances can be realized.

(2) A switch tree can be divided in such a way that a MOSFET on a base point side is arranged as a plurality of divided MOSFETs. Thus, a wiring length near the base point in the tree can be shortened, to bring forth the effect that a higher operating speed can be attained.

(3) MOSFETs on base point sides are respectively arranged as a plurality of divided MOSFETs so as to divide switch trees, and the divided switch trees in first and second groups are alternately arranged, to bring forth the effect that the layout area of MOSFETs constituting the switch trees can be diminished.

(4) Using pre-decoder signals as input signals to be supplied to a switch tree, the number of branches at a branch point can be increased. Thus, the number of stages of the switch tree in the case of obtaining a large number of decoded outputs can be diminished, to bring forth the effect that a higher operating speed can be attained.

While, in the above, the invention made by the inventors has been concretely described in conjunction with embodiments, it is needless to say that this invention is not restricted to the foregoing embodiments but that it can be variously altered within a scope not departing from the subject matter thereof. For example, the load means of a switch tree may well be constructed of MOSFETs of the same conductivity type as that of MOSFETs constituting the switch tree or utilize polycrystalline silicon resistors or the like, or they may well be constructed of a dynamic circuit employing precharging MOSFETs. In addition, in case of providing a pre-decoder circuit, pre-decoded outputs may well be supplied to only specified branch points. Besides, a plurality of columns of decoders may well be driven by common decoder signals.

This invention is extensively applicable, not only to a semiconductor memory such as a dynamic RAM, a static RAM or any of various ROMs, but also to various semiconductor integrated circuits each comprising a decoder circuit which receives digital signals composed of a plurality of (n) bits and forms $\frac{1}{2}^n$ decoded signals.

What is claimed is:

1. A semiconductor integrated circuit device comprising:
    a first terminal;
    a plurality of second terminals;
    a first switching tree portion coupled between said first terminal and said second terminals;
    a third terminal;
    a plurality of fourth terminals;
    a second switching tree portion coupled between said third terminal and said fourth terminals;
    control means coupled to said first and second switching tree portions for controlling said first and second switching tree portions so that one of said first and third terminals is coupled to one of said second and fourth terminals through either said first switching tree portion or said second switching tree portion;
    wherein said first switching tree portion includes a first branch part coupled to said second terminals and having a plurality of first switching elements whose operations are controlled by a first input signal generated by said control means, and a second branch part coupled between said first branch part and said first terminal and having a plurality of second switching elements whose operations are controlled by a second input signal generated by said control means, said second switching tree portion includes a third branch part coupled to said fourth terminals and having a plurality of third switching elements whose operations are controlled by said second input signal, and a fourth branch part coupled between said third branch part and said third terminal and having a plurality of fourth switching elements whose operations are controlled by said first input signal; and
    the number of said first switching elements is larger than that of said second switching elements and the number of said third switching elements is larger than that of said fourth switching elements.

2. A semiconductor integrated circuit device according to claim 1 wherein each of said first, second, third and fourth switching elements includes an insulated-gate field effect transistor.

3. A semiconductor integrated circuit device according to claim 2 wherein each of said first and third terminals is coupled to a first potential terminal for receiving a predetermined potential.

4. A semiconductor integrated circuit device according to claim 3 wherein each of said first and second input signals are complementary signals.

5. A semiconductor integrated circuit device according to claim 4 further comprising load means coupled between said second and fourth terminals and a second potential terminal for receiving a predetermined potential.

6. A semiconductor integrated circuit device according to claim 3 further comprising load means coupled between said second and fourth terminals and a second potential terminal for receiving a predetermined potential.

7. A semiconductor integrated circuit device according to claim 2 further comprising signal generating means coupled to said first terminal for providing a signal to said first terminal, and coupled to said third terminal for providing a signal to said third terminal.

8. A semiconductor integrated circuit device according to claim 7 wherein each of said first and second input signals comprises complementary signals.

9. A semiconductor integrated circuit device according to claim 8 further comprising load means coupled between said second and fourth terminals and a second potential terminal for receiving a predetermined potential.

10. A semiconductor integrated circuit device according to claim 5 wherein said load means includes a plurality of MOSFETs, each of said MOSFETs being coupled between an output terminal and said second potential terminal.

11. A semiconductor integrated circuit device comprising:
control means;
a first terminal;
a plurality of second terminals;
a first switching tree portion, coupled between said first terminal and said second terminals, and coupled to said control means, said first switching tree portion being controlled by said control means so as to couple said first terminal to one of said second terminals through said first switching tree portion, wherein said first switching tree portion includes a first branch part which is coupled to said second terminals and which has a plurality of first switching elements whose operations are controlled by a first signal generated by said control means, and a second branch part which is coupled between said first branch part and said first terminal and which has a plurality of second switching elements whose operations are controlled by a second signal generated by said control means, and wherein the number of said first switching elements is larger than that of said second switching elements;
a third terminal;
a plurality of fourth terminals; and
a second switching tree portion, coupled between said third terminal and said fourth terminals and coupled to said control means, said second switching tree portion being controlled by said control means so as to couple said third terminal to one of said fourth terminals through said second switching tree portion, wherein said second switching tree portion includes a third branch part which is coupled to said fourth terminals and which has a plurality of third switching elements whose operations are controlled by said second signal, and a fourth branch part which is coupled between said third branch part and said third terminal and which has a plurality of fourth switching elements whose operations are controlled by said first signal, and wherein the number of said third switching elements is larger than that of said fourth switching elements.

12. A semiconductor integrated circuit device according to claim 11 wherein each of said first, second, third and fourth switching elements include an insulated-gate field effect transistor.

13. A semiconductor integrated circuit device according to claim 12 wherein each of said first and third terminals is coupled to a first potential terminal for receiving a predetermined potential.

14. A semiconductor integrated circuit device according to claim 13 wherein each of said second and fourth terminals is coupled to load element means.

15. A semiconductor integrated circuit device according to claim 12 further comprising signal generating means coupled to said first terminal for providing a signal to said first terminal, and coupled to said third terminal for providing a signal to said third terminal.

16. A semiconductor integrated circuit device according to claim 15 further comprising load element means coupled to said second and fourth terminals.

17. A semiconductor integrated circuit device according to claim 15 wherein each of said first and second signals comprises complementary signals.

18. A semiconductor integrated circuit device according to claim 13 wherein each of said first and second signals comprises complementary signals.

19. A semiconductor integrated circuit device according to claim 4 further comprising a plurality of word lines each of which is coupled to memory cells, wherein each of said second terminals is coupled to the corresponding word line and each of said fourth terminals is coupled to the corresponding word line.

20. A semiconductor integrated circuit device according to claim 8 further comprising a plurality of word lines each of which is coupled to memory cells, wherein each of said second terminals is coupled to the corresponding word line and each of said fourth terminals is coupled to the corresponding word line.

21. A semiconductor integrated device according to claim 17 further comprising a plurality of word lines each of which is coupled to memory cells, wherein each of said second terminals is coupled to the corresponding word line and each of said fourth terminals is coupled to the corresponding word line.

22. A semiconductor integrated circuit device according to claim 18 further comprising a plurality of word lines each of which is coupled to memory cells, wherein each of said second terminals is coupled to the corresponding word line and each of said fourth terminals is coupled to the corresponding word line.

23. A semiconductor integrated circuit device comprising:
control means;
a first node;
a plurality of second nodes;
a first switching tree portion, coupled to said control means, coupled between said first node and said second nodes, and controlled by said control means to couple said first node to one of said second nodes through said first switching tree portion;
a third node;
a plurality of fourth nodes;
a second switching tree portion, coupled to said control means, coupled between said third node and said fourth nodes, and controlled by said control means to couple said third node to one of said fourth nodes through said second switching tree portion; and
wherein said first switching tree portion includes a first branch part coupled to said second nodes and including a plurality of switching elements, and a second branch part coupled between said first branch part and said first node and including a plurality of switching elements, said second switching tree portion includes a third branch part coupled to said fourth nodes and including a plurality of switching elements, and a fourth branch part coupled between said third branch part and said third node and including a plurality of switching elements, the operations of the switching elements in said first and fourth branch parts are controlled by a first input signal generated by said control means and the operations of the switching elements in said second and third branch parts are controlled by a second input signal generated by said control means, and wherein the number of the switching elements in each of said first and third branch parts is larger than the number of the switching elements in each of said second and fourth branch parts so as to decrease the difference between the number of switching elements to be controlled by said first input signal and the number of switching elements to be controlled by said second input signal.

24. A semiconductor integrated circuit device according to claim 23, wherein each of said switching elements is formed of an insulated-gate field effect transistor.

25. A semiconductor integrated circuit device according to claim 25, wherein each of the first and second input signals comprises complementary input signals.

26. A semiconductor integrated circuit device according to claim 23 further comprising load elements which are respectively coupled to said second nodes, and load elements which are respectively coupled to said fourth nodes.

27. A semiconductor integrated circuit device according to claim 26, wherein said each load element is formed of an insulated-gate field effect transistor.

* * * * *